(12) United States Patent
Yudovsky et al.

(10) Patent No.: US 8,099,817 B2
(45) Date of Patent: Jan. 24, 2012

(54) WAFER EDGE CLEANING

(75) Inventors: Joseph Yudovsky, Campbell, CA (US); Anne-Douce Coulin, Stanford, CA (US); Leon Volfovski, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/042,085

(22) Filed: Mar. 7, 2011

(65) Prior Publication Data

US 2011/0154590 A1    Jun. 30, 2011

Related U.S. Application Data

(62) Division of application No. 12/245,744, filed on Oct. 4, 2008, now Pat. No. 7,900,311, which is a division of application No. 10/976,011, filed on Oct. 28, 2004, now abandoned.

(60) Provisional application No. 60/514,938, filed on Oct. 28, 2003.

(51) Int. Cl.
  *B08B 11/02* (2006.01)
(52) U.S. Cl. ............... 15/77; 15/88.2; 15/88.3; 15/102; 414/936
(58) Field of Classification Search ............. 15/77, 88.2, 15/88.3, 102; 414/936
See application file for complete search history.

(56) References Cited

U.S. PATENT DOCUMENTS

| | | | |
|---|---|---|---|
| 5,861,066 A | 1/1999 | Moinpour et al. | |
| 5,901,399 A | 5/1999 | Moinpour et al. | |
| 6,059,889 A | 5/2000 | Jensen et al. | |
| 6,092,253 A | 7/2000 | Moinpour et al. | |
| 6,222,339 B1 | 4/2001 | Yamasaki et al. | |
| 6,230,753 B1 | 5/2001 | Jones et al. | |
| 6,272,712 B1 | 8/2001 | Gockel et al. | |
| 6,382,901 B1 | 5/2002 | Hong et al. | |
| 6,550,091 B1 | 4/2003 | Radman et al. | |
| 6,594,847 B1 | 7/2003 | Krusell et al. | |
| 6,837,777 B2 | 1/2005 | Ziemins et al. | |
| 6,910,240 B1 | 6/2005 | Boyd et al. | |
| 2002/0005212 A1 | 1/2002 | Beardsley et al. | |
| 2004/0049870 A1 | 3/2004 | Tolles et al. | |
| 2005/0172430 A1 | 8/2005 | Yudovsky et al. | |
| 2006/0096048 A1 | 5/2006 | Mikhaylichenko et al. | |

(Continued)

FOREIGN PATENT DOCUMENTS

EP    1 058 296    * 12/2000

OTHER PUBLICATIONS

Office Action of U.S. Appl. No. 10/976,011 mailed Jul. 9, 2008.

(Continued)

*Primary Examiner* — Randall Chin
(74) *Attorney, Agent, or Firm* — Dugan & Dugan, PC

(57) ABSTRACT

In a first aspect, an apparatus for cleaning a thin disk is provided. The apparatus includes a support roller for supporting a rotating wafer within a wafer cleaner. The support roller comprises a guide portion, for receiving an edge of a wafer, having an inclined surface comprising a low-friction material and adapted to allow the wafer edge to slide thereagainst; and an edge-trap portion for retaining the edge of the wafer and having a transverse surface comprising a high-friction material and adapted, when in communication with the edge of the wafer, to resist sliding thereagainst. Numerous other aspects are provided.

6 Claims, 14 Drawing Sheets

U.S. PATENT DOCUMENTS

2009/0031511 A1  2/2009  Yudovsky et al.
2009/0044831 A1  2/2009  Yudovsky et al.

OTHER PUBLICATIONS

Oct. 9, 2008 Response to Office Action of U.S. Appl. No. 10/976,011 mailed Jul. 9, 2008.
Final Office Action of U.S. Appl. No. 10/976,011 mailed Jan. 28, 2009.
Notice of Abandonment of U.S. Appl. No. 10/976,011 mailed Aug. 12, 2009.
Office Action of U.S. Appl. No. 12/245,745 mailed Jul. 16, 2009.
Oct. 16, 2009 Response to Office Action of U.S. Appl. No. 12/245,745 mailed Jul. 16, 2009.
Oct. 12, 2009 Response to Office Action of U.S. Appl. No. 12/245,744 mailed Jul. 10, 2009.
Final Office Action of U.S. Appl. No. 12/245,744 mailed Jan. 26, 2010.
Final Office Action of U.S. Appl. No. 12/245,745 mailed Feb. 3, 2010.
Apr. 26, 2010 Response to Final Office Action submitted with RCE of U.S. Appl. No. 12/245,744 mailed Jan. 26, 2010.
Office Action of U.S. Appl. No. 12/245,744 mailed May 4, 2010.
Restriction Requirement of U.S. Appl. No. 10/976,011 mailed Mar. 5, 2008.
Apr. 7, 2008 Response to Restriction Requirement of U.S. Appl. No. 10/976,011 mailed Mar. 5, 2008.
Restriction Requirement of U.S. Appl. No. 12/245,745 mailed Mar. 23, 2009.
May 26, 2009 Response to Restriction Requirement of U.S. Appl. No. 12/245,745 mailed Mar. 23, 2009.
Restriction Requirement of U.S. Appl. No. 12/245,744 mailed Mar. 20, 2009.
Apr. 20, 2009 Response to Restriction Requirement of U.S. Appl. No. 12/245,744 mailed Mar. 20, 2009.
Examiner Interview Summary of U.S. Appl. No. 12/245,744 mailed Mar. 24, 2010.
Interview Summary of U.S. Appl. No. 12/245,744, filed Mar. 29, 2010.
Aug. 3, 2010 Response to Office Action of U.S. Appl. No. 12/245,744 mailed May 4, 2010.
Final Office Action of U.S. Appl. No. 12/245,744 mailed Aug. 25, 2010.
Examiner Interview Summary of U.S. Appl. No. 12/245,744 mailed Oct. 25, 2010.
Interview Summary of U.S. Appl. No. 12/245,744, filed Oct. 22, 2010.
Examiner Interview Summary of U.S. Appl. No. 12/245,744 mailed Oct. 29, 2010.
Nov. 29, 2010 Response to Final Office Action of U.S. Appl. No. 12/245,744 mailed Aug. 25, 2010.
Notice of Abandonment of U.S. Appl. No. 12/245,745 mailed Jan. 4, 2011.
Notice of Allowance of U.S. Appl. No. 12/245,744 mailed Jan. 7, 2011.
Office Action of U.S. Appl. No. 12/245,744 mailed Jul. 10, 2009.

* cited by examiner

WAFER EDGE CLEANING

This application is a division of, and claims priority to, U.S. Non-Provisional patent application Ser. No. 12/245,744, filed Oct. 4, 2008, and titled "WAFER EDGE CLEANING", which is a division of, and claims priority to, U.S. Non-Provisional patent application Ser. No. 10/976,011, filed Oct. 28, 2004, and titled "WAFER EDGE CLEANING", which claims priority to U.S. Provisional Application Ser. No. 60/514,938, filed Oct. 28, 2003, and titled "WAFER EDGE CLEANING". Each of these patent applications is hereby incorporated by reference herein in their entirety for all purposes.

FIELD OF THE INVENTION

The present invention relates generally to cleaning thin disks, such as semiconductor wafers, compact disks, glass substrates and the like. More particularly, the invention relates to scrubbing devices for simultaneously scrubbing the entire surface of a thin disk, including the edges thereof.

BACKGROUND OF THE INVENTION

To manufacture a thin disk such as a semiconductor wafer, an elongated billet of semiconductor material is cut into very thin slices or disks, about mm in thickness. The slices or wafers of semiconductor material are then lapped and polished by a process that applies an abrasive slurry to the wafer's surfaces. After polishing, slurry residue conventionally is cleaned or scrubbed from wafer surfaces via a mechanical scrubbing device, such as a device which employs polyvinyl acetate (PVA) brushes, brushes made from other porous or sponge-like material, or brushes having bristles made from nylon or similar materials. Although these conventional cleaning devices remove a substantial portion of the slurry residue which adheres to wafer edges, slurry particles nonetheless may remain and produce defects during subsequent processing.

A conventional PVA brush scrubber is shown in the side elevational view of FIG. 1. The conventional scrubber 11, shown in FIG. 1, comprises a pair of PVA brushes 13a, 13b, a platform 15 for supporting a wafer W, and a mechanism (not shown) for rotating the pair of PVA brushes 13a, 13b. The platform 15 comprises a plurality of rollers 17a-c for both supporting and rotating the wafer W.

Preferably, the pair of PVA brushes 13a, 13b are positioned to extend beyond the edge of the wafer W, so as to facilitate cleaning the wafer's edge. However, research shows that slurry induced defects still occur, and are caused by slurry residue remaining along the edges of the wafer despite cleaning with apparatuses such as that described above. Specifically, subsequent processing has been found to redistribute slurry residue from the wafer edges to the front of the wafer, causing defects.

A number of devices have been developed to improve wafer edge cleaning. One such device is shown in the side elevational view of FIG. 2. The edge-cleaning scrubber 19, shown in FIG. 2, includes a pair of rollers 17b, 17c adapted to support and rotate the wafer W, and further includes an edge-cleaning roller 21 that fits over the edge of the wafer W for cleaning the edge as the wafer rotates. Although the edge-cleaning roller 21 addresses the need to clean slurry residue from wafer edges, it can be subject to quick wear, such wear typically being concentrated at locations where it contacts the wafer W.

FIGS. 3A-3C illustrate details related to how the edge-cleaning roller 21 of the edge-cleaning scrubber 19 of FIG. 2 cleans the edge of the wafer W. Referring to the side elevational view of FIG. 3A, which shows the wafer W above the edge-cleaning roller 21, the edge-cleaning roller 21 of FIG. 2 is shown in contact with the wafer W. Specifically, opposing first and second inclined surfaces 23, 25 of the edge-cleaning roller 21 are in contact with respective opposite first and second edge corners 27, 29 of the edge of the wafer W. For example, either or both of the first and second edge corners 27, 29 may comprise a bevel so as to form, e.g., a truncated frustoconical edge surface (not separately shown) which may be placed in surface-to-surface contact with the first and second inclined surfaces 23, 25 of the edge cleaning roller 21.

Referring to the side elevational view of FIG. 3B, in which the wafer W is shown in phantom across the edge-cleaning roller 21, the wafer W rotates in a nominal rotation plane 31, as does the edge-cleaning roller 21. By "nominal rotation plane" is meant that plane within which the wafer W is expected to rotate based on the specific arrangement of rollers (e.g., the rollers 17b, 17c) used to support, drive and guide the wafer W within the edge-cleaning scrubber 19 of FIG. 2. Further, it may be seen that contact between inclined surfaces 23, 25 of the edge-cleaning roller 21 and the first and second edge corners 27, 29 of the wafer W takes place along respective first and second contact areas 33, 35 on the inclined surfaces 23, 25.

Referring to the cross-sectional view of the edge-cleaning roller 21 shown in FIG. 3C, corresponding to section 3C-3C as shown on FIG. 3B, the first contact area 33 on the first inclined surface 23 translates to a ring-shaped wear sector 37 on the first inclined surface 23, typically relatively narrow, which performs the edge-cleaning function and is subject to friction-induced wear over time. Conversely, the remaining portions of the first inclined surface 23 may not typically contact the wafer W during edge cleaning, and therefore may not be subject to such friction-induced wear.

Other rollers that may rotate in a common plane with a wafer W while contacting a portion of the wafer edge, but that perform additional or separate functions such as rotating the wafer W (e.g., drive rollers, such as the spinning mechanism 17a-c of FIG. 1) or guiding the rotating wafer W so as to limit or prevent tilting of the same (e.g., idling guide rollers (not separately shown)), are typically also subject to rapid wear where contact is made with the wafer W. The cost of maintaining proper operation of such parts and/or conducting frequent replacement of the same can mount quickly.

Accordingly the field of wafer cleaning requires methods and apparatus for effectively performing one or more of the functions of cleaning, supporting, driving and guiding both the flat surfaces and the edge surfaces of a semiconductor wafer, preferably so as to reduce the cost and/or frequency of replacement due to frictional wear from wafer contact.

SUMMARY OF THE INVENTION

The present invention addresses the need for a more effective edge cleaner by providing a number of different roller embodiments that are adapted for wafer edge cleaning. Specifically:

(1) for cleaning the edge bevel of a wafer, an edge cleaning roller is adapted to rotate within a plane that is at an angle to a first plane in which the wafer is supported and rotated;

(2) for cleaning the circumferential edge of a wafer, an edge cleaning roller is provided with a flat-bottomed channel having a frictional surface along the channel's bottom; and/or (3) for cleaning an edge region of a major surface of a wafer, an edge cleaning roller is provided with a straight-walled channel having a frictional surface along at least one of the straight walls thereof.

In a first aspect of the invention, an apparatus for cleaning a thin disk is provided. The apparatus includes (1) a plurality of support rollers adapted to support an edge of the thin disk as the thin disk rotates within a first plane; and (2) an edge-cleaning roller adapted to rotate within a second plane oriented at a first non-zero angle to the first plane, so as to contact an edge bevel of the thin disk while so rotating.

In a second aspect of the invention, a support roller is provided for supporting a vertically rotating wafer. The support roller includes (1) a guide portion, for receiving an edge of a wafer, having an inclined surface comprising a low-friction material and adapted to allow the wafer edge to slide thereagainst; and (2) an edge-trap portion for retaining the edge of the wafer and having a transverse surface comprising a high-friction material and adapted, when in communication with the edge of the wafer, to resist sliding thereagainst.

In a third aspect of the invention, a side-contact roller is provided for contacting one or more major surfaces of a rotating wafer. The side-contacting roller includes (1) a guide portion, for receiving an edge of a wafer, having an inclined surface comprising a low-friction material and adapted to allow the wafer edge to slide thereagainst; and (2) an edge-trap portion for retaining the edge of the wafer and having a planar surface comprising a high-friction material and adapted, when in communication with a major surface of the wafer, to resist sliding thereagainst. Numerous other aspects, as are methods in accordance with these and other aspects of the invention.

Other features and aspects of the present invention will become more fully apparent from the following detailed description, the appended claims and the accompanying drawings.

DETAILED DESCRIPTION

Edge Cleaning Roller

Figure 3A:
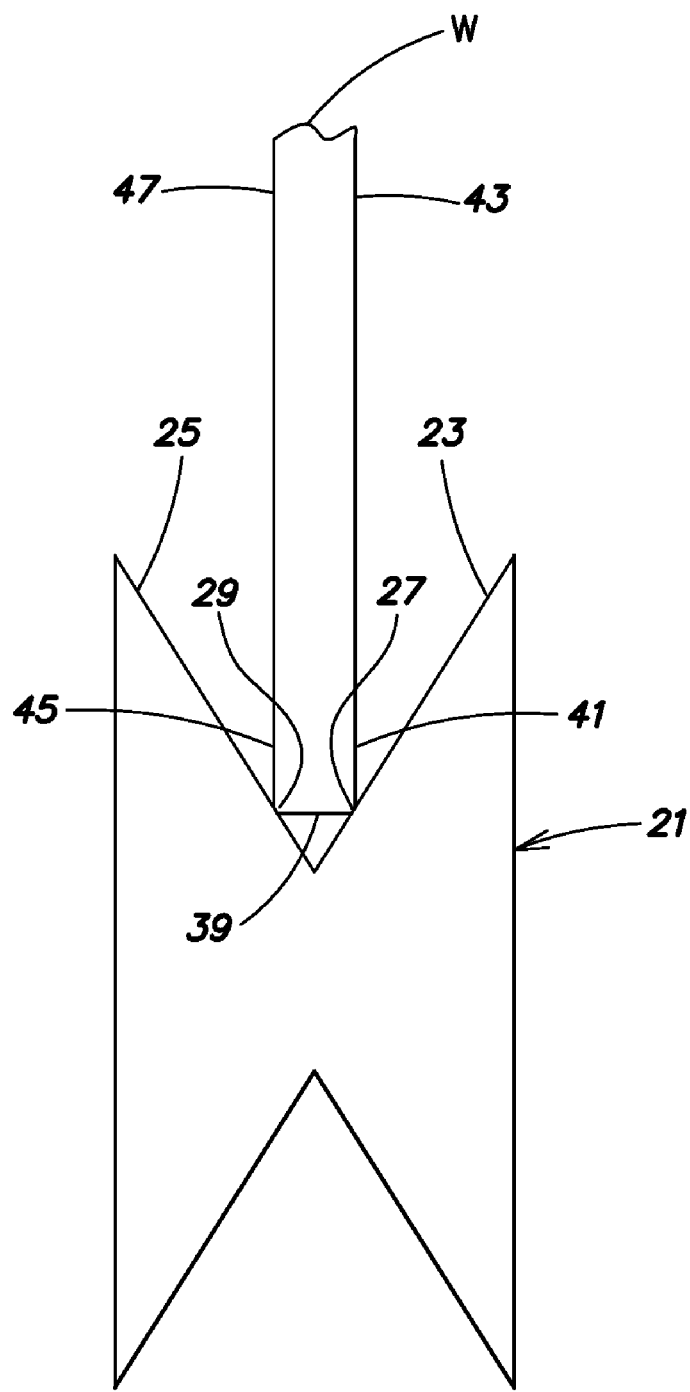
FIG. 3A is a side elevational view of the edge-cleaning roller of FIG. 2, shown cleaning the edge corners of the wafer W.
Figure 4:
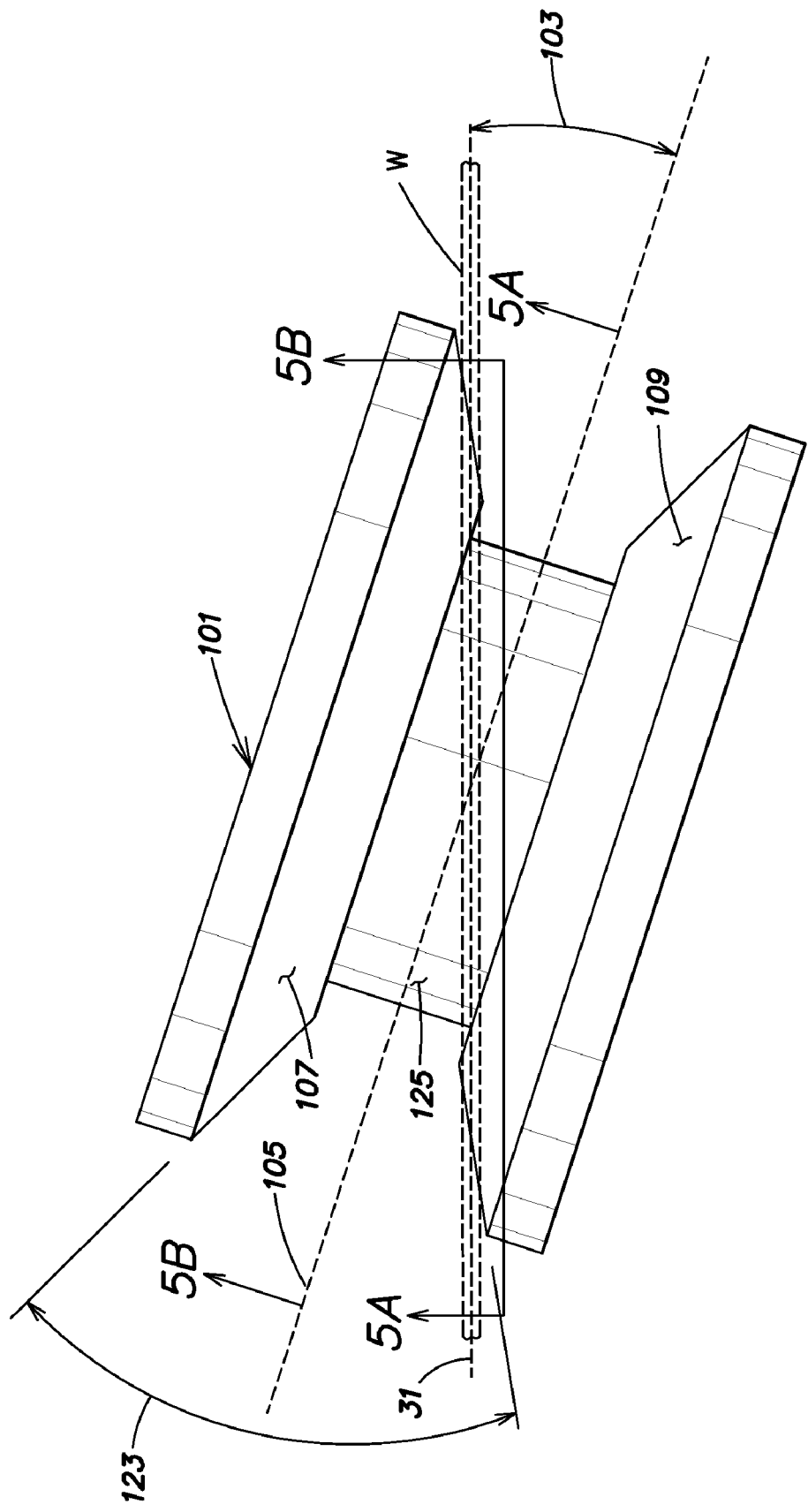
FIG. 4 is a side elevational view of an inventive edge-cleaning roller, shown contacting edge corners of the wafer W and in an inventive angled orientation to a plane of rotation of the wafer W.

FIG. 4 is an side elevational view of an inventive edge-cleaning roller 101 in which the wafer W is shown in phantom across the edge-cleaning roller 101, the edge-cleaning roller 101 being adapted to contact edge surfaces (e.g., edge bevels as described above with reference to FIG. 3A) of the wafer W for cleaning. Where, as described above, the wafer W is supported and driven so as to rotate and remain within the nominal rotation plane 31 of the wafer W (rotation and support means for the same not being shown), the edge-cleaning roller 101 may be inventively oriented relative to the wafer W so as to form a first angle 103, the first angle 103 being that angle which is described between the nominal rotation plane 31 of the wafer W and a rotation plane 105 within which the edge-cleaning roller 101 is disposed and is adapted to rotate.

Figure 8:
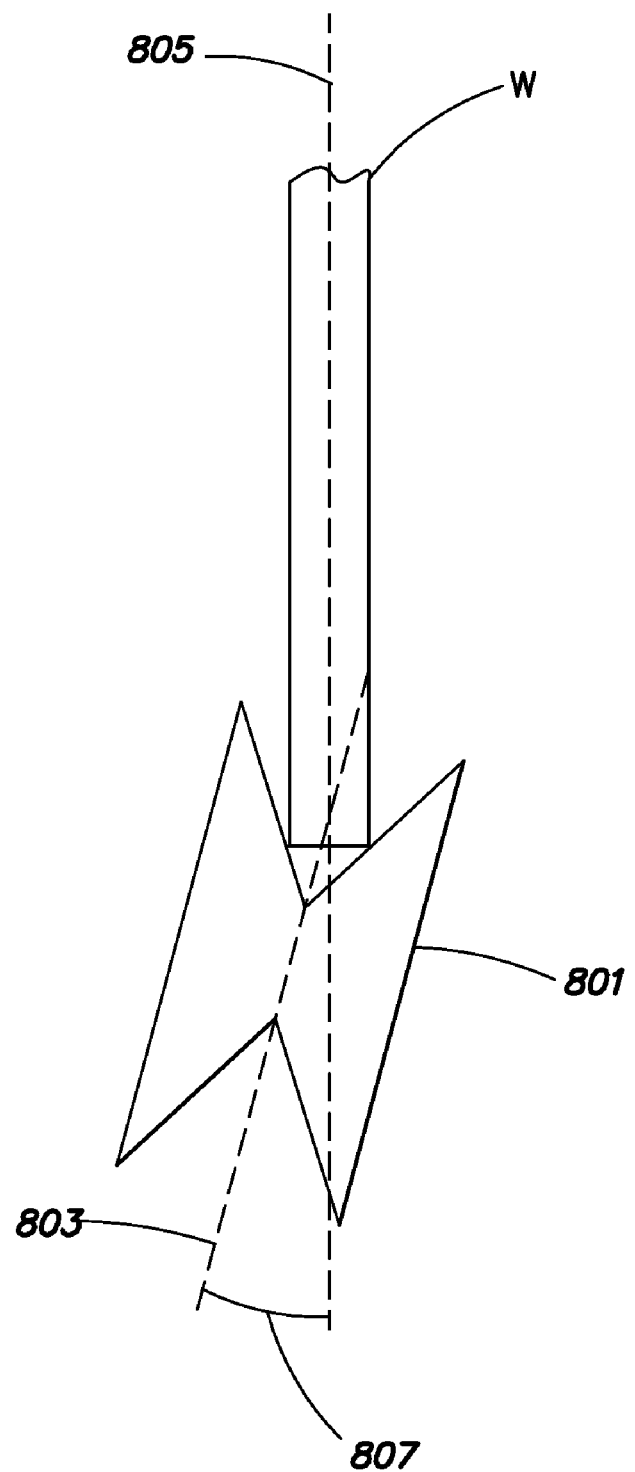
FIG. 8 is a side elevational view of an inventive edge-cleaning roller, shown contacting edge corners of the wafer W and in another inventive angled orientation to a plane of rotation of the wafer W.
Figure 9:
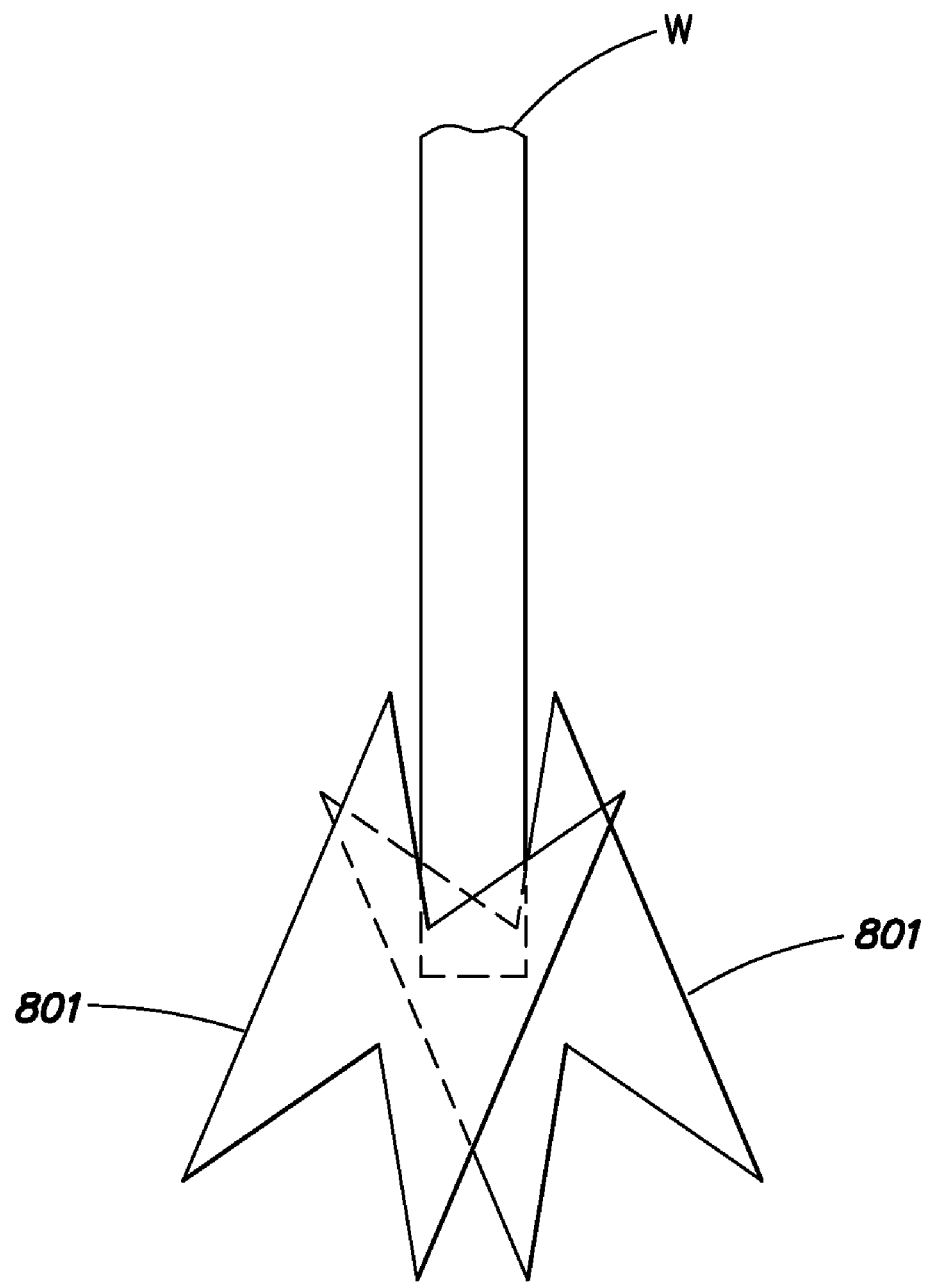
FIG. 9 is a side elevational view of two inventive edge-cleaning rollers of FIG. 8, shown contacting edge corners of the wafer W and in opposite inventive angled orientations to a plane of rotation of the wafer W.

As shown in FIG. 4, the rotation plane 105 of the edge-cleaning roller 101 may be oriented relative to the nominal rotation plane 31 of the wafer W such that, in forming the first angle 103, the rotation planes intersect along a line (not separately shown) generally extending radially outward from the center of rotation of the wafer W. Other relative orientations are possible, such as a relative orientation between the rotation planes whereby the planes intersect along a line generally extending tangentially to the wafer W, as is illustrated in FIGS. 8 and 9 and as will be described later.

Referring again to FIG. 4, the edge-cleaning roller 101 may comprise opposing first and second inclined surfaces 107, 109 which contact the respective opposite first and second edge corners 27, 29 (FIG. 3A) of the edge of the wafer W. By contrast to the pattern of contact between the wafer W and the edge-cleaning roller 21 as shown above in FIGS. 3A and 3B, e.g., in which both the first and the second edge corners 27, 29 of the wafer W are contacted by the edge-cleaning roller 21 at substantially the same radial location along the perimeter of the wafer W, the inventive angled orientation of the edge-cleaning roller 101 relative to the wafer W shown in FIG. 4 may result in divergent radial contact locations along the perimeter of the wafer W. For example, as shown in the planar view of a major surface of the wafer W shown in FIG. 5A (corresponding to the view 5A-5A of FIG. 4), contact between the first inclined surface 107 (FIG. 4) of the edge-cleaning roller 101 and the first edge corner 27 of the wafer W may occur at a first radial location 111 along the perimeter of the wafer W, contact between the second inclined surface 109 (FIG. 4) of the edge-cleaning roller 101 and the second edge corner 29 of the wafer W may occur at a second radial location 113 along the perimeter of the wafer W, and a second angle 115 separates the first radial location 111 and the second radial location 113.

Referring again to FIG. 4, the inventive angled orientation of the edge-cleaning roller 101 relative to the wafer W may result in a longer useful life for the edge-cleaning roller 101. For example, where in FIGS. 3A and 3C it is shown that coplanar orientation between the respective rotation planes of the edge-cleaning roller 21 and the wafer W may result, as mentioned above, in a relatively narrow ring-shaped wear sector 37 on the first inclined surface 23 of the edge-cleaning roller 21, the inventive angled orientation of FIG. 4 may increase wear sector width, thus distributing the edge-cleaning function over larger contact areas (see 121, FIG. 5B) on the inclined surfaces of the edge-cleaning roller 101. The inventive angled orientation of FIG. 4 therefore may increase the wafer's edge cleaning duty cycle and may extend the useful life of the roller 101.

Figure 5A:
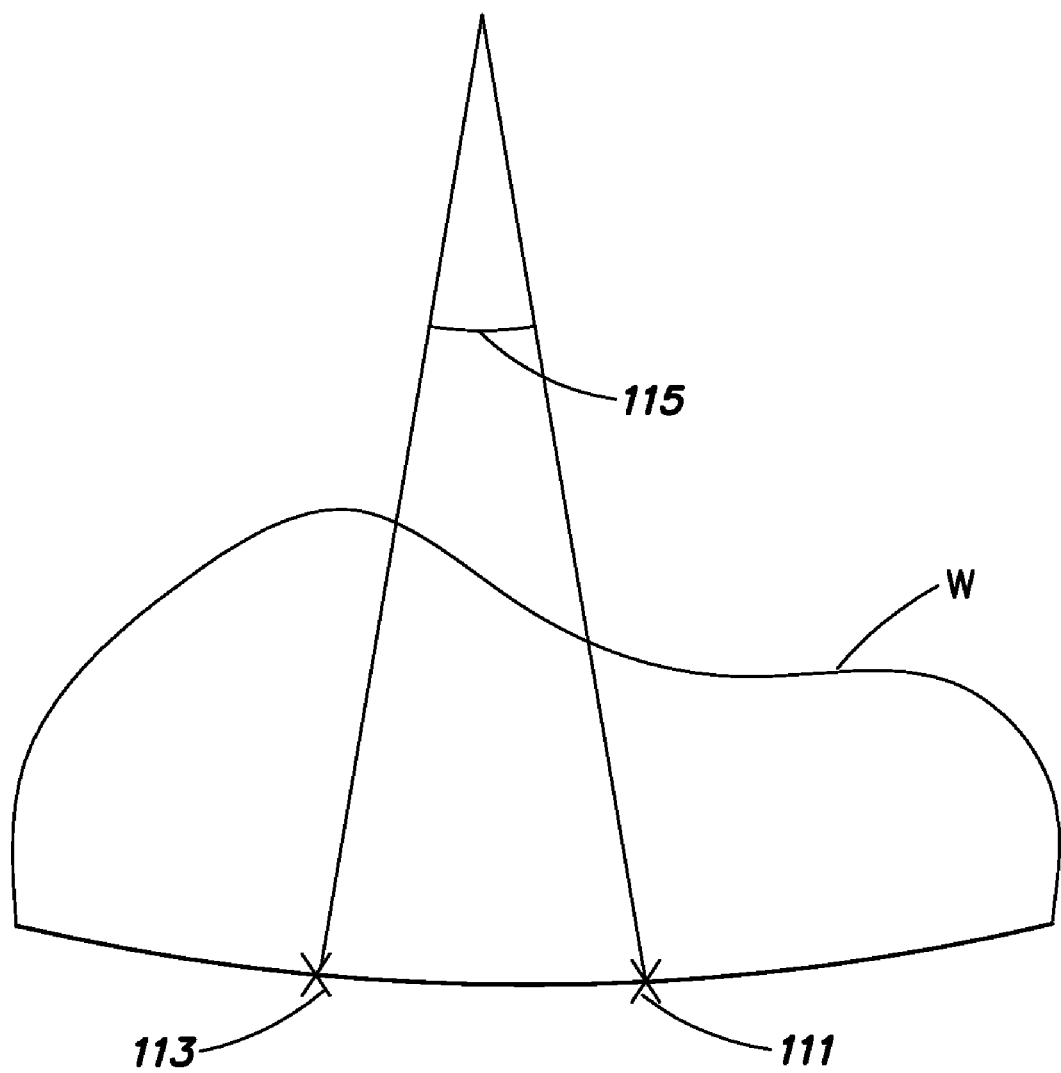
FIG. 5A is a view, corresponding to view 5A-5A of FIG. 4, of a major surface of the wafer W showing separate radial locations at which the inventive edge-cleaning roller of FIG. 4 contacts respective edge corners of the wafer W.
Figure 5B:
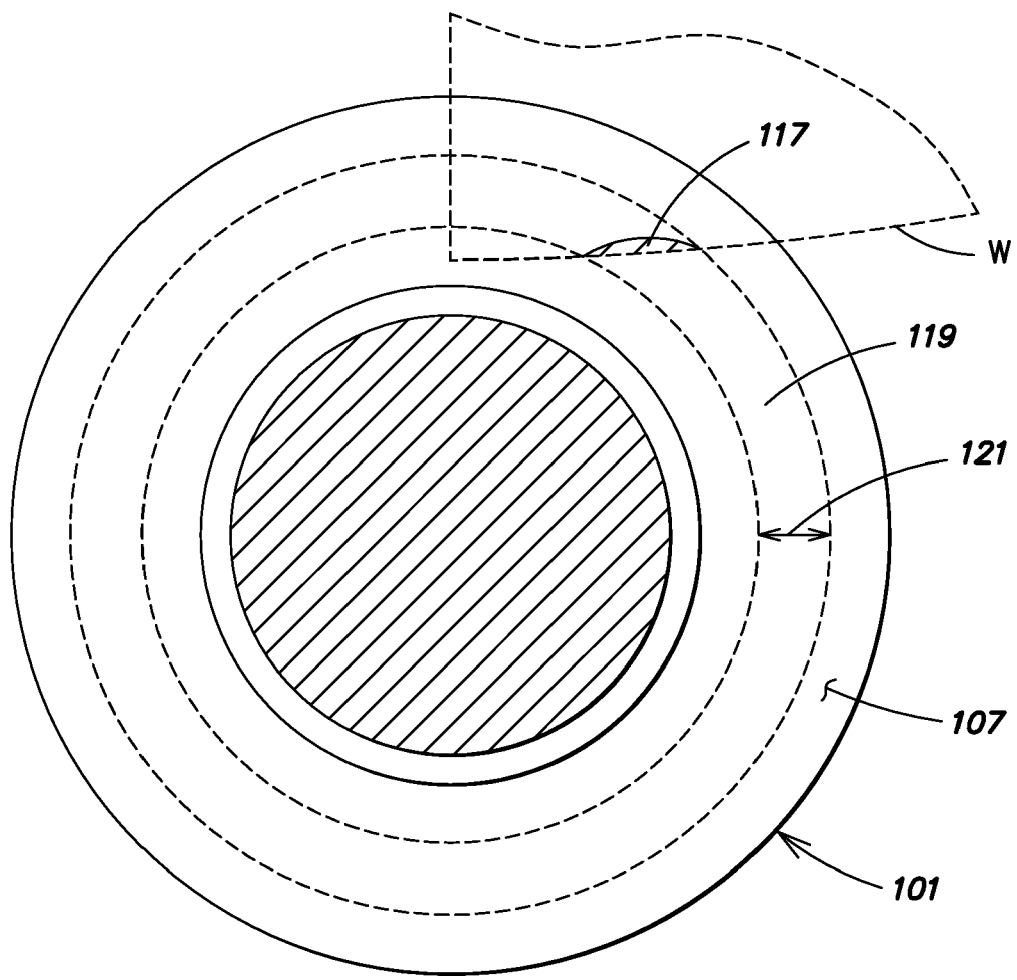
FIG. 5B is a cross-sectional view, corresponding to view 5B-5B of FIG. 4, of the inventive edge-cleaning roller of FIG. 4 showing a relatively wide wear sector on an inclined surface of the edge-cleaning roller where contact is made with an edge corner of the wafer W.

FIG. 5B, which is a cross-sectional view of the edge-cleaning roller 101 taken along a section 5B-5B of FIG. 4, illustrates the above-described feature. Referring to FIG. 5B, contact between the first inclined surface 107 of the edge-cleaning roller 101 and the edge of the wafer W (shown in phantom) at the first edge corner 27 (FIG. 3A) of the wafer W takes place along a first contact area 117 on the first inclined surface 107, and a ring-shaped wear sector 119 on the second inclined surface 109 may be produced thereby (e.g., by virtue of the rotation of the edge-cleaning roller 101) having a characteristic width 121.

Figure 3B:
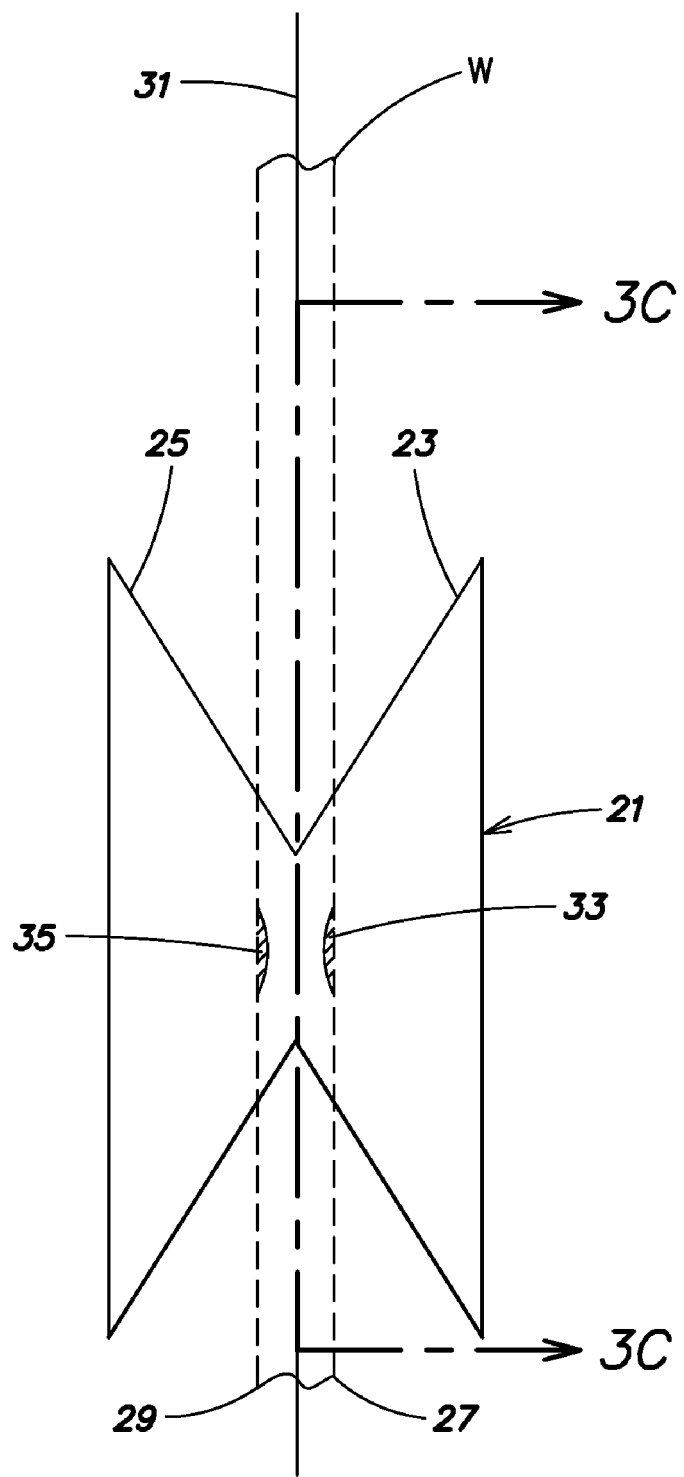
FIG. 3B is another side elevational view of the edge-cleaning roller of FIG. 2, shown contacting the wafer W along contact areas on respective inclined surfaces of the edge-cleaning roller.
Figure 3C:
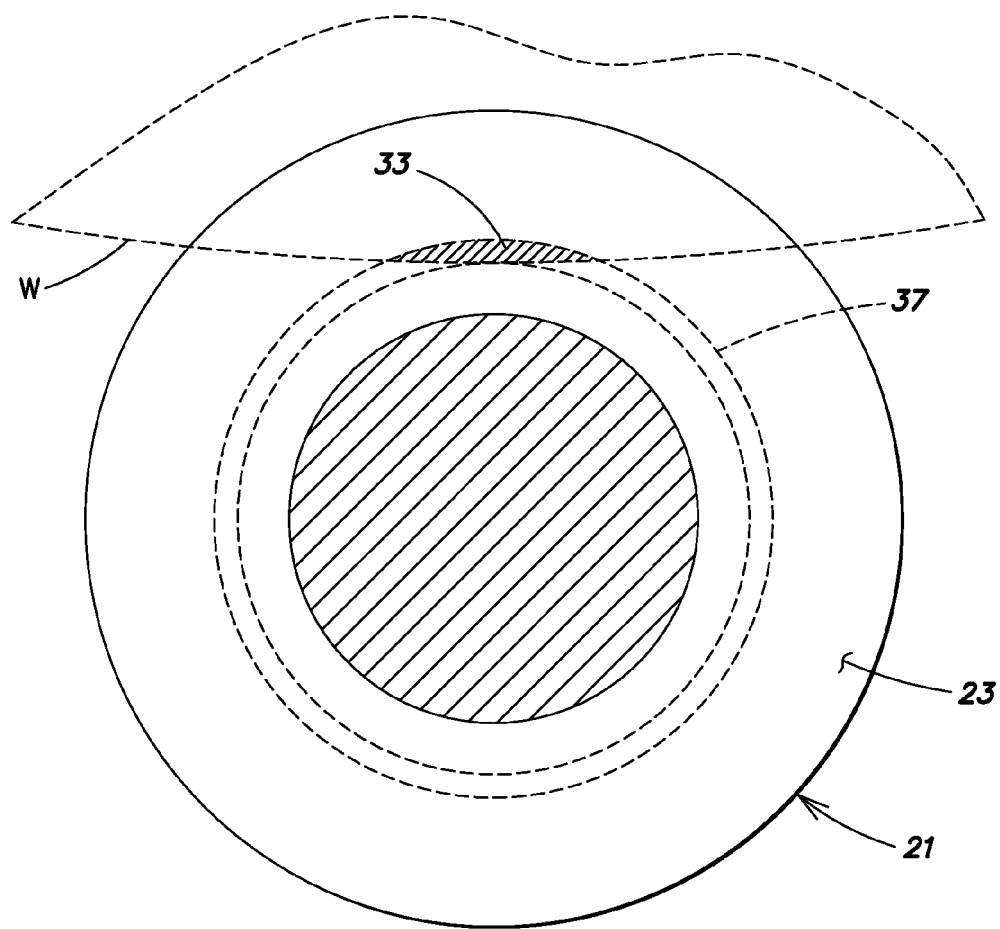
FIG. 3C is a cross-sectional view, corresponding to view 3C-3C of FIG. 2, of the edge-cleaning roller of FIG. 2 showing a relatively narrow wear sector on an inclined surface of the edge-cleaning roller where contact is made with an edge corner of the wafer W.

As shown in FIG. 5B, the first contact area 117 tends to extend not only laterally across the slope of the first inclined surface 107, e.g., similarly to the first contact area 33 of FIG. 3C, but also up the slope of the first inclined surface 107, e.g., in contrast to the first contact area 33 of FIG. 3C. It may readily be seen, therefore, that the width 121 of the ring-shaped wear sector 119 on the first inclined surface 109 of the edge-cleaning roller 101 may be proportionately greater than a corresponding dimension (not separately shown) of the wear sector 37 on the first inclined surface 23 of the edge-cleaning roller 21 of FIGS. 3A-3C. Given a greater wear sector width, it follows that the area of the first inclined surface 107 subjected to friction-induced wear during wafer edge cleaning (i.e., the wear sector area) will be proportionately greater.

Assuming the degree of edge cleanliness required by the process remains the same, providing a greater area for the ring-shaped wear sector 119 as described above can reduce the edge-cleaning burden per unit area of the wear sector, which may result in a longer useful life for the edge-cleaning roller 101. For example, given a larger portion of the first inclined surface 107 of the edge-cleaning roller 101 is being used to clean the first edge corner 27 of the wafer W, edge cleaning may be more efficient, thus allowing, e.g., the length of time that the first inclined surface 107 is applied to the first edge corner 27 of the wafer W to be decreased, or the contact pressure between the same to be reduced, while still producing the required degree of wafer edge cleanliness. Those possessing skill in the art will recognize that the same dynamic exists between the second edge corner 29 (FIG. 3A) of the wafer W and the second inclined surface 109 (FIG. 4) of the edge-cleaning roller 101, resulting in a similar beneficial broadening of a corresponding wear sector (not separately shown), and the same benefits as to part life.

Those possessing skill in the art will also recognize that additional flexibilities may be obtained by dividing edge-cleaning contact between the edge-cleaning roller 101 and the wafer W between radially spaced-apart locations on the edge of the wafer W, e.g., as shown in FIG. 5A. For example, in some embodiments of the edge-cleaning roller 101, a third angle 123 (see FIG. 4) described between the first inclined surface 107 and the second inclined surface 109 may be provided that is wider than is typical for edge-cleaning rollers, e.g., so as to more readily facilitate rotation of the rotation plane 105 of the edge-cleaning roller 101 relative to the nominal rotation plane 31 of the wafer W. Nevertheless, despite the wider third angle 123, the respective effective angles of contact (not shown) between the first inclined surface 107 and the second inclined surface 109 relative to the nominal rotation plane 31 of the wafer (e.g., as measured along the slope of the first inclined surface 107 normal to the direction along which the scrubber 117 extends, and along the slope of the second inclined surface 109 in a corresponding direction) may be controlled so as to be equivalent to those of typical edge-cleaning rollers.

Alternatively, if it is desired to increase the wafer's edge cleaning "duty cycle", e.g., that angular fraction of the wafer's perimeter which is in contact with the inclined surfaces 107, 109 of the edge-cleaning roller 101 at any given time, or if it is desired to increase the size of an area of edge-cleaning contact on one or more edge surfaces of the wafer W, the same angles of contact may be reduced below that which is typical, in effect narrowing the angular gap between the inclined surfaces 107, 109 of the edge-cleaning roller 101 and the major surfaces of the wafer W. This may be accomplished without undue risk of causing the edge of the wafer to become wedged between the inclined surfaces of the edge-cleaning roller 101 and the rotation of the wafer W to become impeded thereby, e.g., since an angular space exists in the form of the second angle 115 between the first and second radial locations 111, 113 (FIG. 5A) along the perimeter of the wafer W at which contact with the inclined surfaces 107, 109 of the edge-cleaning roller 101 takes place.

Many different angles may be specified for the third angle 123. For example, applicants observe that an angle of 70 degrees, ±10 degrees, produces a good result.

The edge-cleaning roller 101 may further include a normal surface 125 (FIG. 4), e.g., cylindrical in shape, and occupying a space between the inclined surfaces of the edge-cleaning roller 101. Such a space may be introduced so as to facilitate the rotation of the edge-cleaning roller 101 relative to the nominal rotation plane 31 of the wafer W. Although many different widths may be specified for such a space, including widths of up to 10 mm or more, applicants observe that a dimension of 2 mm, ±1 mm produces a good result. In addition, the normal surface 125 in that space may or may not be disposed directly adjacent to the inclined surfaces. For example, the normal surface 125 may comprise a bottom surface of a channel disposed in a space between the inclined surfaces (see, e.g., FIG. 4).

In some modes of use of the edge-cleaning roller 101, the normal surface 125 is spaced apart from a cylindrical edge surface 39 (FIG. 3A) of the wafer W while the first inclined surface 107 and the second inclined surface 109 of the edge-cleaning roller 101 clean the edge corners 27, 29 of the wafer W. In other modes of use of the edge-cleaning roller 101, the normal surface 125 may be caused to contact and/or support and/or clean the cylindrical edge surface 39 of the wafer W.

In addition, applicants observe that beneficial edge cleaning may be provided where the first angle 103 described between the rotation plane 105, within which the edge-cleaning roller 101 is disposed, and the nominal rotation plane 31 (FIG. 3B) of the wafer W, ranges from 10-30 degrees. Optionally, therefore, the first angle 103 may be set at 15 degrees, which applicants observe produces a good result.

Values of (1) a width of the space between the first inclined surface 107 and the second inclined surface 109, (2) the third angle 123, and (3) the first angle 103 may be established/selected via an iterative, coordinated design process, so as to produce the desired interaction between the edge-cleaning roller 101 and the wafer W. Alternatively, selection of such values may be performed automatically based on the desired result. Respective values of 3 mm, 50 degrees, and 20 degrees for those three values provide a good result.

Furthermore, if desired, a slight torque may be introduced, e.g., to increase a frictional cleaning pressure between the inclined surfaces 107, 109 of the edge-cleaning roller 101 and the edge corners 27, 29 (FIG. 3A) of the wafer W. In some embodiments, such a torque serves to increase an area of the edge of the wafer W to be cleaned by the edge-cleaning roller 101, without undue risk of the wafer's edge being pinched between the inclined surfaces of the edge-cleaning roller 101 and thus without wafer rotation tending to be inhibited thereby.

In operation, the wafer W may be inserted between the first inclined surface 107 and the second inclined surface 109 of the edge-cleaning roller 101, placed in contact with same, e.g., according to the pattern of FIG. 5A, and rotated in the nominal rotation plane 31 (FIG. 3B). For example, the wafer may be inserted between the first inclined surface 107 and the second inclined surface 109 of the edge-cleaning roller 101 with the rotation plane 105 of the edge-cleaning roller 101 preliminarily in a coplanar relationship with the nominal rotation plane 31 of the wafer W, and the edge-cleaning roller 101 may thereafter be rotated to achieve the desired first angle 103. Alternatively, the first angle 103 may be established prior to the wafer W being introduced to the edge-cleaning roller 101.

As mentioned above, the edge-cleaning roller 101 may be utilized in a mode in which contact with the wafer W is restricted to the first inclined surface 107 and the second inclined surface 109. Alternatively, and as also mentioned above, the cylindrical edge surface 39 of the wafer W may also be made to contact a normal surface 125 (FIG. 4) of the edge-cleaning roller 101 at one or more times, e.g., either before or during wafer edge cleaning, or before or during rotation of the edge-cleaning roller 101.

Where sliding contact is intended between the edge-cleaning roller 101 and the wafer W, the surfaces of the edge-cleaning roller 101 involved may be adapted so as to further improve cleaning through greater friction. For example, such surfaces may comprise polyurethane, or some other suitable frictional material.

Additionally, edge surfaces of the wafer W and frictional surfaces of the edge-cleaning roller 101 may be caused to rotate at different velocities so as to enhance sliding contact. For example, the speed of rotation of the edge-cleaning roller 101 may be controlled via a separate motor, e.g., so as to cause the normal surface 125 to rotate at a different velocity than the cylindrical edge surface of the wafer W it contacts. Also for example, the speed of the edge-cleaning roller 101 may be selectively retarded (e.g., with a brake) if the wafer W itself is used to drive the edge-cleaning roller 101.

Where the edge corners 27, 29 (FIG. 3A) of the wafer W comprise edge bevels, the first and second inclined surfaces 107, 109 of the edge-cleaning roller 101 may be angled and disposed so as to increase an area of the edge bevels of the wafer W contacted/cleaned by the inclined surfaces. For example, the effective angles described between the inclined surfaces along the areas of contact described above and the nominal rotation plane 31 of the wafer W can be controlled so as to maximize contact with the edge bevels.

Additional Edge-Cleaning Rollers

FIGS. 6A, 6B, 7A and 7B illustrate additional rollers adapted to achieve frictional contact with the edge of the wafer W, e.g., for purposes of driving or supporting the wafer W, and/or for preventing tilting thereof during rotation. It will be understood, also, that where the rollers of FIGS. 6A-B and 7A-B achieve frictional contact with the edge of the wafer W, edge cleaning of the wafer may also take place, such that the rollers may also be denominated edge-cleaning rollers, e.g., either by design, or by virtue of how they are used in conjunction with a wafer edge.

Figure 6A:
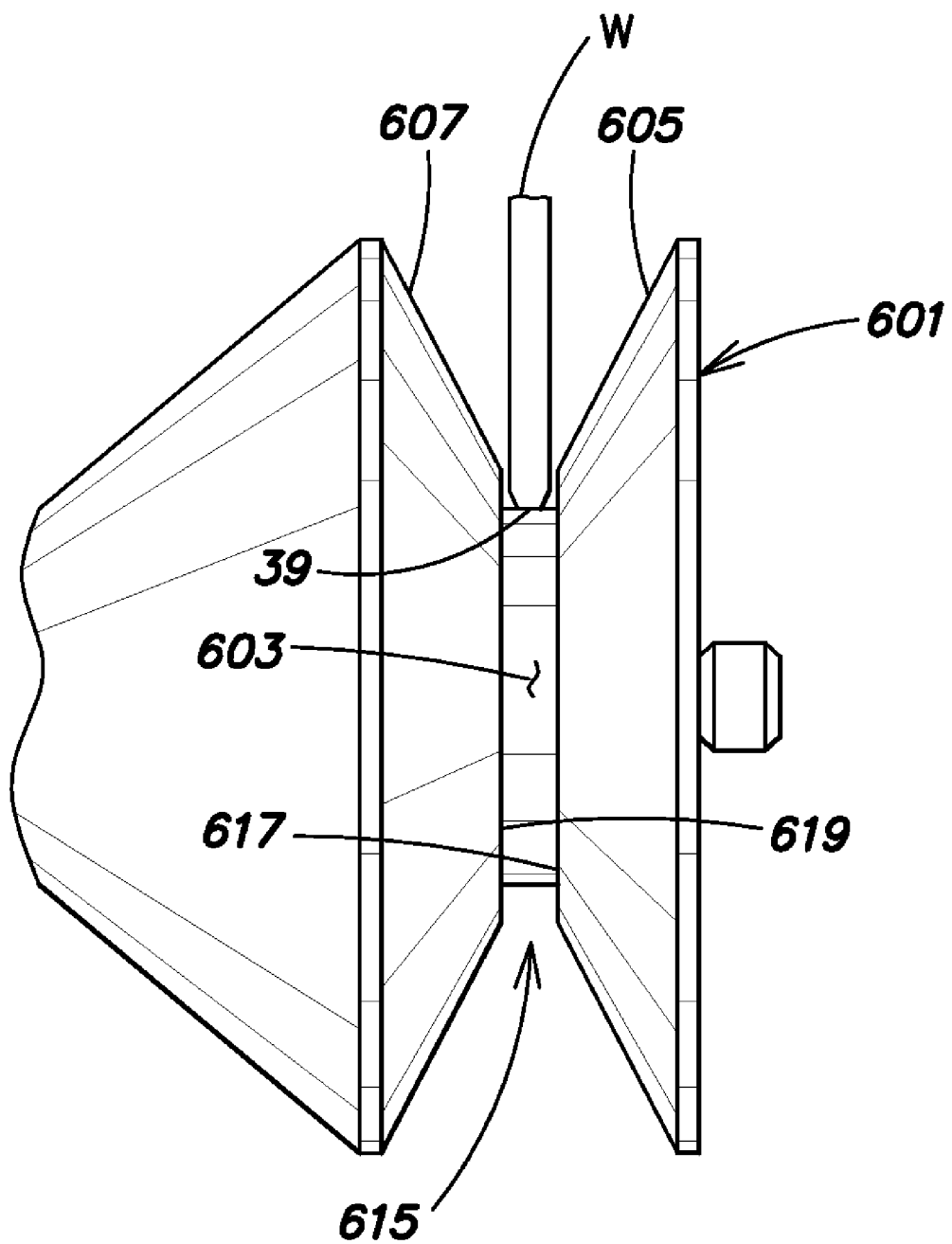
FIG. 6A is a side elevational view of an inventive edge-cleaning support roller, shown in contact with a cylindrical edge surface of the wafer W.
Figure 6B:
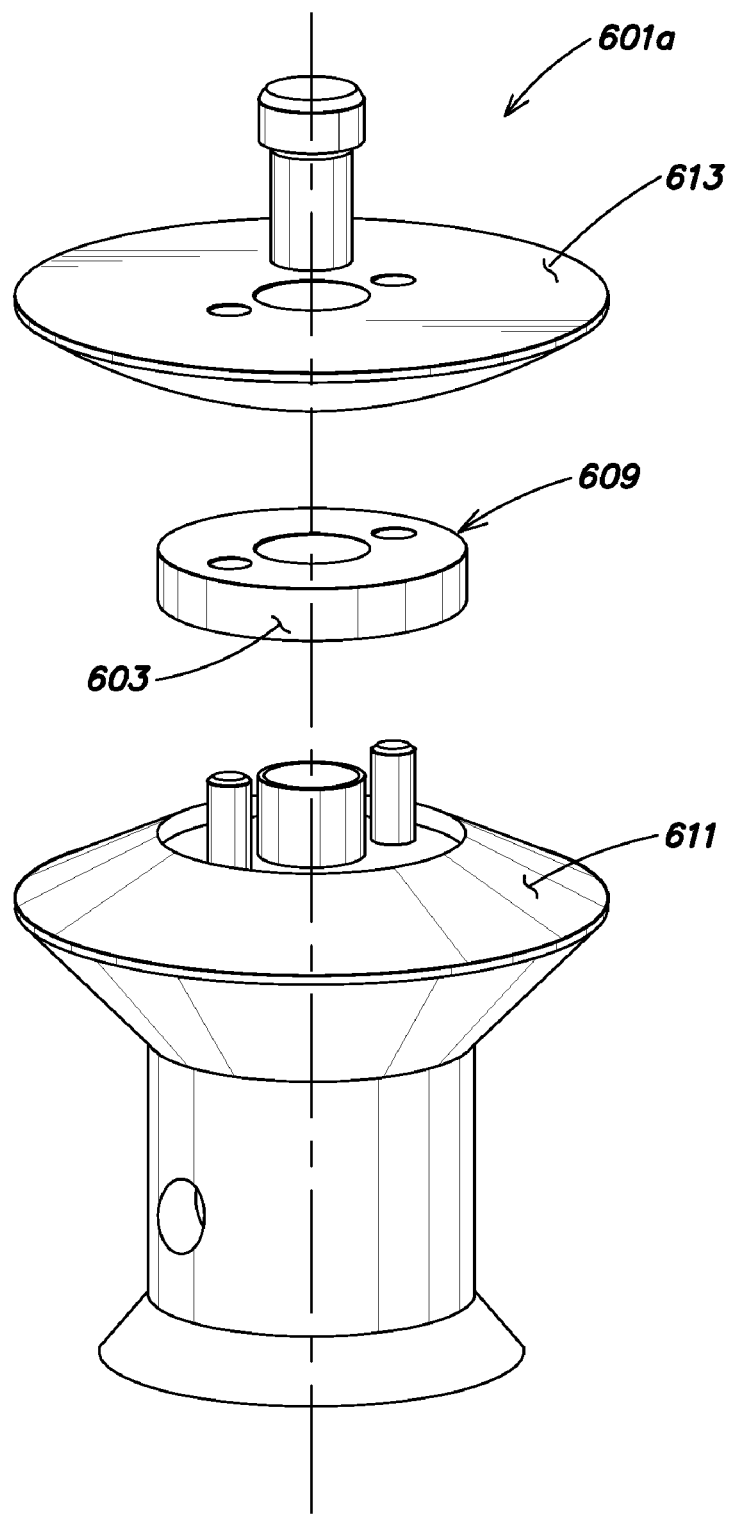
FIG. 6B is an exploded assembly perspective view of an edge-cleaning support roller that is a particular embodiment of the inventive edge-cleaning support roller of FIG. 6A.
Figure 7A:
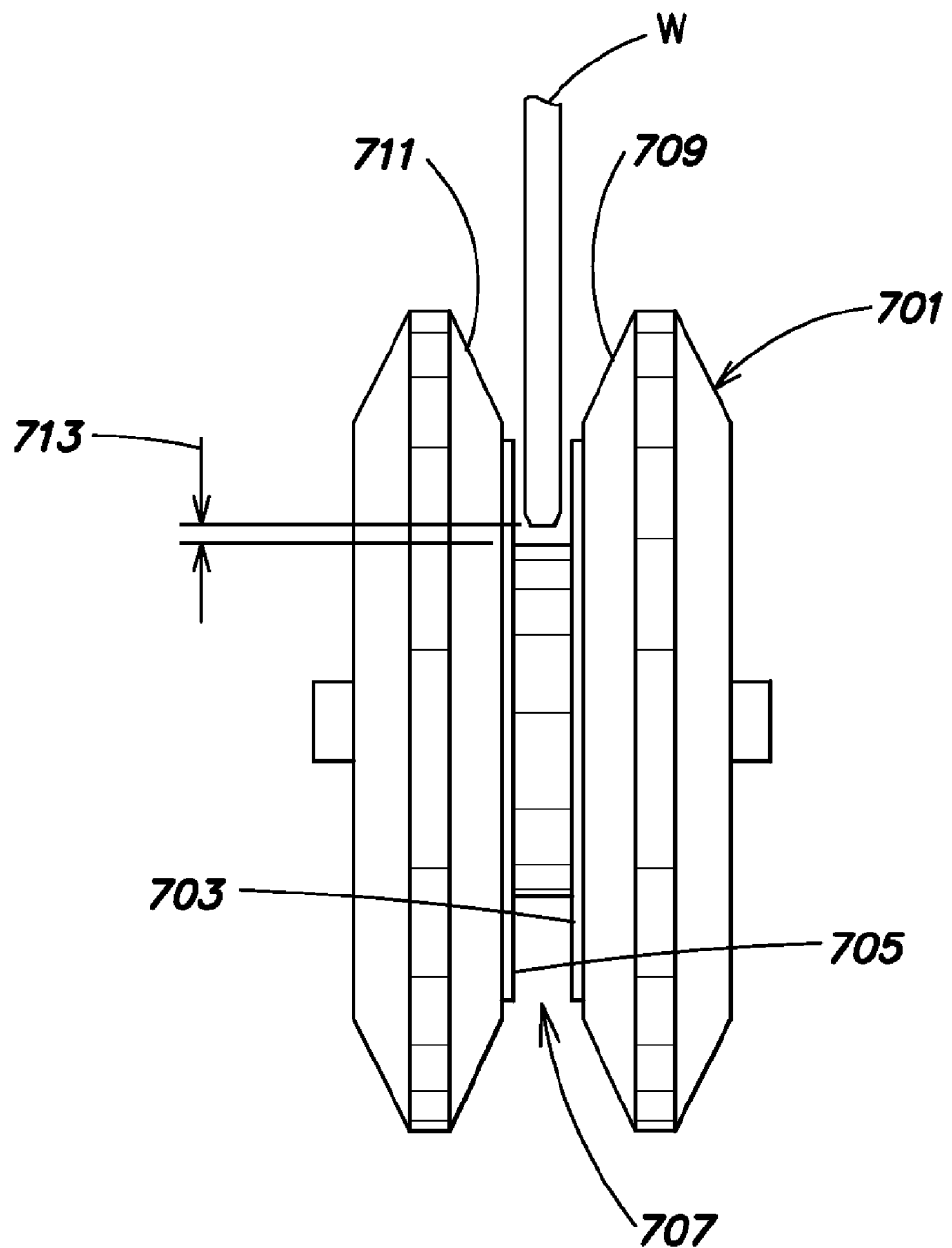
FIG. 7A is a side elevational view of an inventive edge-cleaning side-contact roller, shown engaging the edge of the wafer W.
Figure 7B:
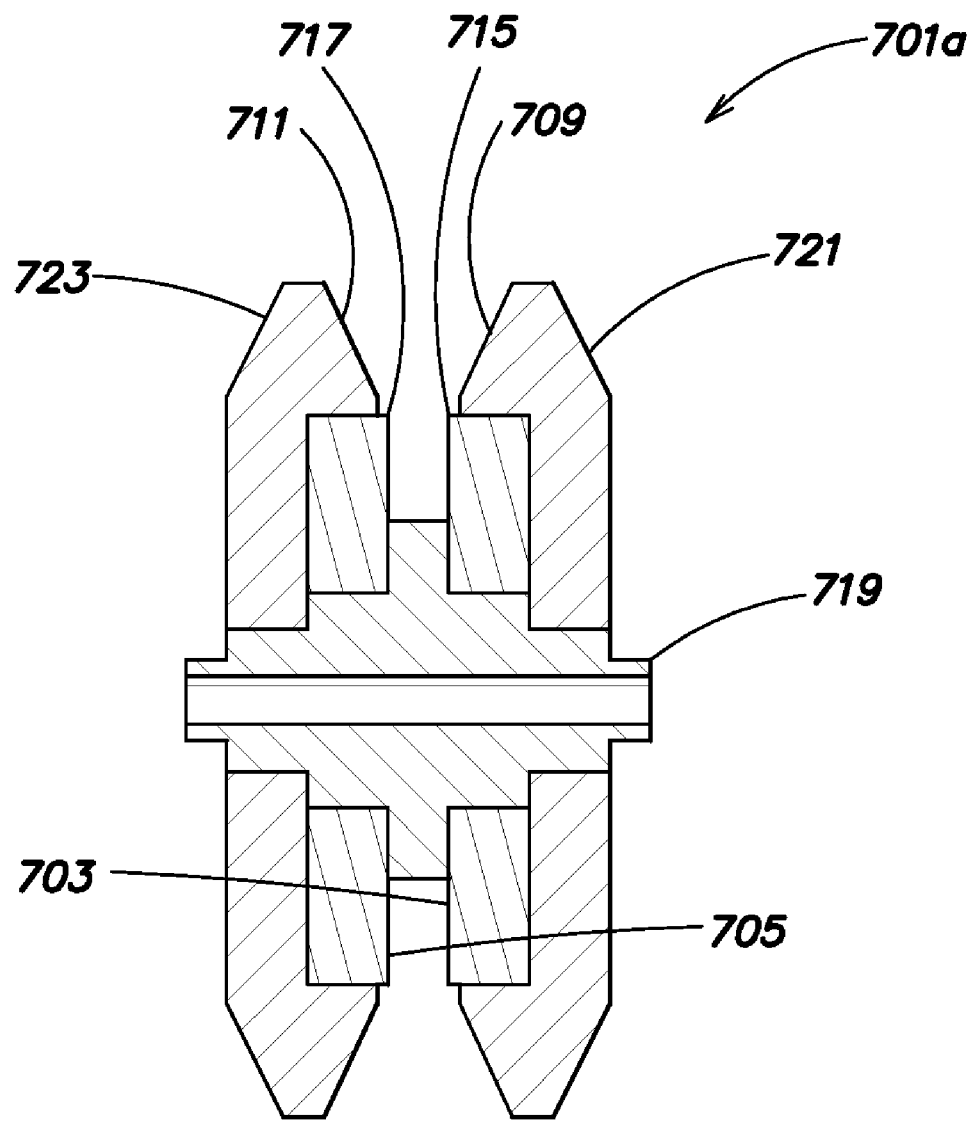
FIG. 7B is a cross-sectional view of an edge-cleaning side-contact roller that is a particular embodiment of the inventive edge-cleaning side-contact roller of FIG. 7A.

Unlike the edge-cleaning roller 101 of FIGS. 4 and 5A-B, which is adapted to achieve frictional contact with edge corners (or edge bevels) 27, 29 (FIG. 3A) of the wafer W, the rollers of FIGS. 6A-B and 7B are adapted to achieve frictional contact with edge surfaces of the wafer W that may be adjacent to the edge corners 27, 29. For example, the roller of FIGS. 6A-B is adapted to achieve frictional contact with the cylindrical edge surface 39 (FIG. 3A) between the edge corners 27, 29, and the roller of FIGS. 7A-B is adapted to achieve frictional contact with one or both of a first edge-adjacent region 41 (FIG. 3A) of a first major surface 43 (FIG. 3A) of the wafer W, and a second edge-adjacent region 45 (FIG. 3A) of a second major surface 47 of the wafer W (FIG. 3A). Additionally, the rollers of FIGS. 6A-B and 7A-B may comprise easily replaceable frictional components adapted to bear the greater portion of friction-induced wear where such frictional contact between the rollers and the wafer W is intended to occur. Such frictional components may be of low cost relative to other components of the rollers, and may assist in reducing and/or minimizing the cost of maintaining the rollers at a proper performance level, given that a certain level of wear may be anticipated and planned for.

Edge-Cleaning Support Roller

FIG. 6A is a side elevational view of an inventive support roller 601, shown adjacent to a wafer W and in contact with the cylindrical edge surface 39 of the wafer W. The support roller 601 comprises a cylindrical frictional surface 603, e.g., comprising polyurethane or some other suitable frictional material, adapted to achieve frictional contact with the cylindrical edge surface 39 (FIG. 3A) of the wafer W, as shown in FIG. 6A. The support roller 601 is adapted, via such frictional contact, to support and/or rotate the wafer W.

In operation, the edge of the wafer W may be introduced between first and second guide surfaces 605, 607 of the support roller 601, which may comprise low-friction, low-wear material such as virgin PTFE to encourage sliding communication with the edge of the wafer W down the slopes of the guide surfaces 605, 607 toward the cylindrical frictional surface 603. Once frictional contact is established between the cylindrical frictional surface 603 of the support roller 601 and the cylindrical edge surface 39 of the wafer W, the support roller 601 may be used to rotatably support and/or drive the wafer W. As described above, the cylindrical frictional surface 603 of the support roller 601 may also be used to clean the wafer W's cylindrical edge surface 39, e.g., via rubbing contact caused by unmatched speeds of rotation.

FIG. 6B illustrates a particular embodiment of the support roller 601 of FIG. 6A (support roller 601a), shown in an exploded assembly perspective view. As shown in FIG. 6B, the cylindrical frictional surface 603 of the support roller 601a may comprise a portion of a friction disk 609, which may be of a simple, low-cost design adapted to minimize cost of replacement.

The support roller 601a may further comprise a main body 611, of which the second guide surface 607 may comprise a part, and an end portion 613, of which the first guide surface 605 may comprise a part. The friction disk 609 may be adapted to fit between the main body 611 and the end portion 613, and the assembly may be adapted to be secured such that the friction disk 609 rotates along with the main body 611 and the end portion 613.

The support roller 601a may still further comprise a channel 615 (FIG. 6A) comprising first and second sides 617, 619 (FIG. 6A) for retaining the edge of the wafer during rotational support thereof (e.g., by forming an "edge-trap" for retaining the edge of the wafer that includes the frictional surface 603 (FIG. 6B)). In the embodiment of FIG. 6A, the frictional surface 603 may form a transverse frictional surface that is adapted to contact the edge of the wafer and resist sliding thereagainst. The channel 615 may be straight, i.e., the first side 617 and the second side 619 of the channel 615 may be arranged so as not to form a V, unlike the first inclined surface 23 and the second inclined surface 25 of the edge-cleaning roller 21 of FIG. 3A. Additionally, an offset may be established between the first side 617 and the second side 619 of the channel 615 that is sufficiently large to permit insertion of the edge of the wafer W, which may have, for example, a nominal thickness of 0.030 inches, and yet is sufficiently small so as to prevent tilt in the wafer W during rotation of the same, e.g., via low-friction contact between the first side 617 of the channel 615 and the first edge-adjacent region 41 (FIG. 3A) of the wafer W and/or between the second side 619 of the channel 615 and the second edge-adjacent region 45 (FIG. 3A) of the wafer W.

Edge-Cleaning Side-Contact Roller

FIG. 7A is a side elevational view of an inventive side-contact roller 701, shown adjacent to a wafer W. The side-contact roller 701 comprises a first frictional planar surface 703, e.g., comprising polyurethane or some other suitable frictional material, adapted to achieve frictional contact with the first edge-adjacent region 41 (FIG. 3A) of the wafer W. The side-contact roller 701 may additionally comprise a second frictional planar surface 705, similar to the first frictional planar surface 703, and adapted to achieve frictional contact with the second edge-adjacent region 45 (FIG. 3A) of the wafer W. The first frictional planar surface 703 and the second frictional planar surface 705 may comprise sides of a straight channel 707, e.g., similar to that described above with reference to FIG. 6B, such that the edge of the wafer W may be accommodated between the channel sides, and tilt in the wafer W may be prevented. The side-contact roller 701 is adapted to rotate the wafer W via frictional contact between the frictional planar surfaces of the side-contact roller 701 and the edge-adjacent regions of the major surfaces of the wafers.

In operation, the edge of the wafer W may be introduced between first and second guide surfaces 709, 711 of the side-contact roller 701, which may comprise a low-friction, low-wear material such as virgin PTFE to encourage sliding communication with the edge of the wafer W down the slopes of the guide surfaces 709, 711 toward the channel 707 of the side-contact roller 701. Once the edge of the wafer W has been inserted into the channel 707, e.g., between the first frictional planar surface 703 and the second frictional planar surface 705, a vertical gap 713 may be maintained between the cylindrical edge surface 39 (FIG. 3A) of the wafer W and a corresponding portion of the side-contact roller 701 to restrict contact between the side-contact roller 701 and the wafer W to the frictional "side" contact described above (i.e., at the edge-adjacent regions of the wafer's major surfaces), which frictional contact may be employed to drive the wafer W. Specifically, the wafer W may be vertically supported by other rollers (not shown) that prevent the wafer W from fully descending into the channel 707. As described above, the first frictional planar surface 703 and the second frictional planar surface 705 of the side-contact roller 701 may also be used to clean the edge-adjacent regions of the wafer's major surfaces, e.g., via rubbing contact.

FIG. 7B illustrates a particular embodiment of the side-contact roller 701 of FIG. 7A (side-contact roller 701a), shown in a cross-sectional view. As shown in FIG. 7B, the first frictional planar surface 703 of the side-contact roller 701a may comprise a portion of a first friction ring 715, which may be of a simple low-cost design adapted to minimize cost of replacement. Also, as shown in FIG. 7B, if the side-contact roller 701a includes a second frictional planar surface 705, the second frictional planar surface 705 may comprise a portion of a similar second friction ring 717.

The side-contact roller 701a may further comprise a hub 719, a first guide ring 721 mounted on the hub 719 of which the first guide surface 709 may comprise a part, and a second guide ring 723 mounted on the hub 719 of which the second guide surface 711 may comprise a part. The first friction ring 715 and the second friction ring 717 may also be mounted on the hub 719, e.g., between the first guide ring 721 and the second guide ring 723 as shown. An assembly may be formed thereby in which all components rotate in unison.

Wafer Cleaning Apparatus Including the Above Inventive Rollers

Figure 1:
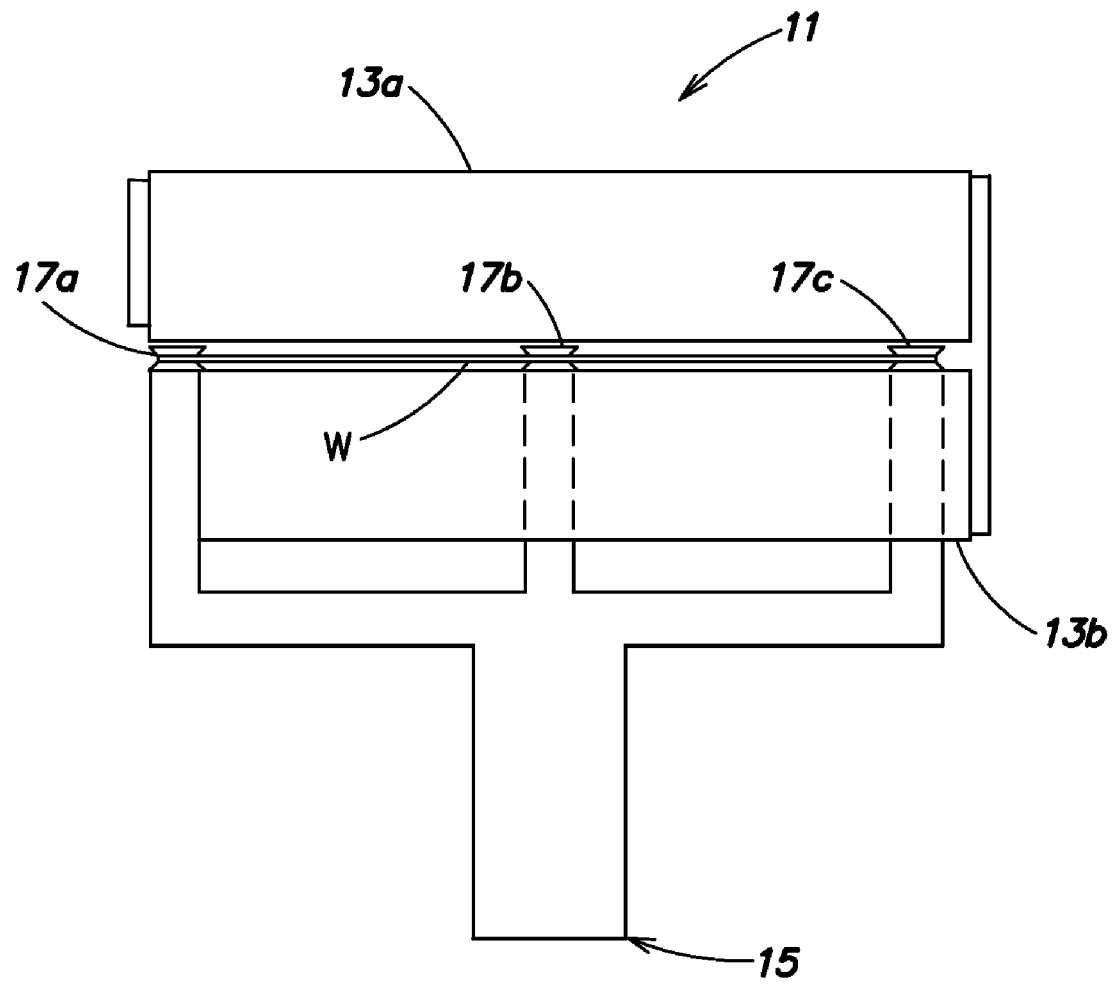
FIG. 1 is a side elevational view of a conventional PVA brush scrubber.
Figure 2:
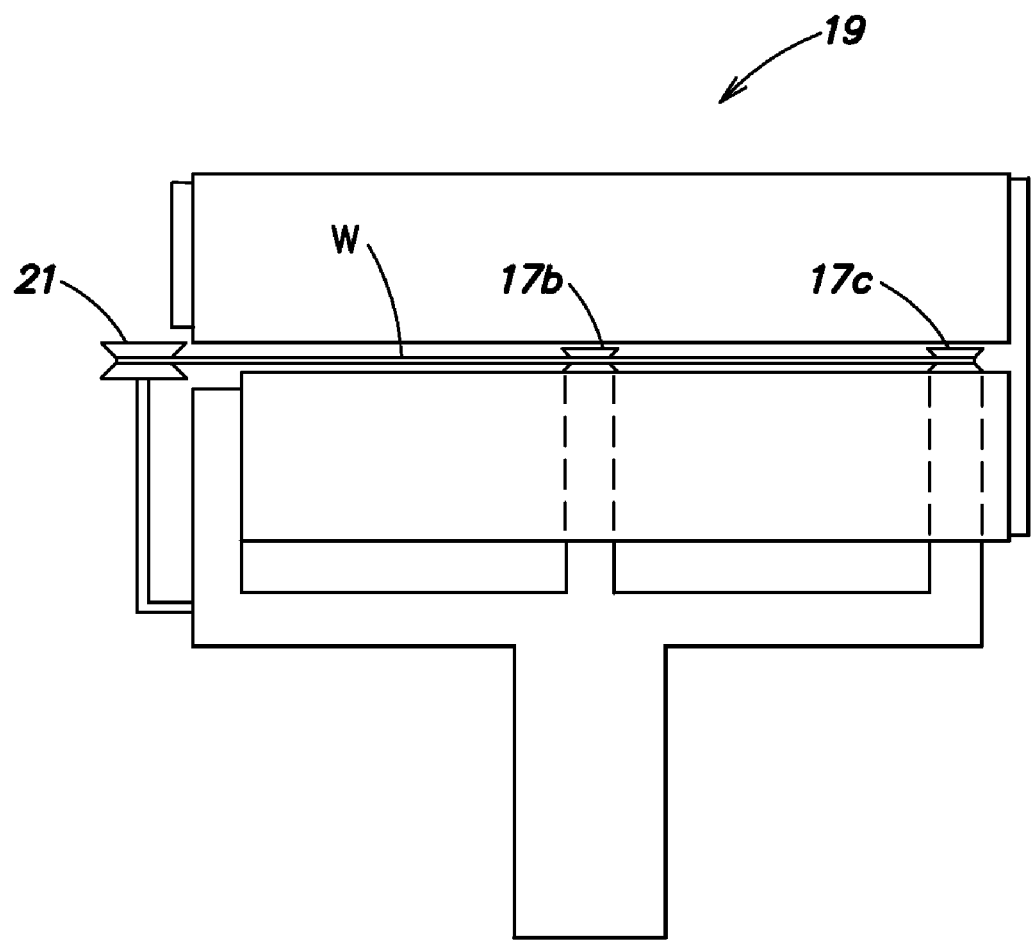
FIG. 2 is a side elevational view of a conventional scrubber comprising a conventional edge-cleaning roller for improving wafer edge cleaning.

One or more edge-cleaning rollers of FIGS. 4 and 5A-B, and one or more of the frictional rollers of FIGS. 6A-B and 7A-B may be incorporated within a wafer cleaning apparatus (not separately shown) utilizing scrubber brushes to clean major surfaces of a wafer in a manner similar to that of the scrubber mechanism of FIG. 2. Such a mechanism can take many forms and/or perform many functions, including:

(1) comprising separate drive motors for the edge cleaning roller and the other frictional rollers, e.g., so as to facilitate an angled plane of rotation for the edge-cleaning roller;

(2) comprising a toggle enabling the edge-cleaning roller to switch between a mode in which it either lags behind or exceeds the speed of rotation of the wafer edge so as to slide against the wafer edge when in contact with it, and a mode in which it matches the wafer edge speed and therefore does not slide thereagainst when contacting the same;

(3) allowing the angle between the plane of rotation of the edge-cleaning roller and the plane of rotation of the wafer to be selectively varied;

(4) permitting the edge cleaning roller to toggle between speed-matching and speed-lagging or speed-exceeding modes while other frictional rollers remain in a speed-matching mode;

(5) the toggle of (2) above comprising a clutch that engages for speed-exceeding or speed-lagging and disengages for speed matching; and/or (6) the toggle of (2) above comprising a friction brake that engages for speed-lagging and disengages for speed matching.

Other configurations are also permissible.

The foregoing description discloses only exemplary embodiments of the invention. Modifications of the above disclosed apparatus and methods which fall within the scope of the invention will be readily apparent to those of ordinary skill in the art. For instance, according to one or more embodiments, such as shown in FIG. 8, an edge cleaning roller 801 may be provided having a plane of rotation 803 at an inventive angled orientation to the plane of rotation 805 of the wafer W, e.g., as described by an angle 807, such that the plane of rotation 803 of the roller 801 intersects the plane of rotation 805 of the wafer W along a line (not separately shown) extending generally tangentially to the wafer W (e.g., as opposed to extending generally radially from the center of the wafer W as in the embodiment of FIG. 4). Such an arrangement permits the creation of multiple wear sectors on a single inclined surface of the roller 801 by permitting removal, inversion, and reinstallation of the same roller 801 midway through a useful life that may be twice that of a conventionally oriented roller. This may be possible, for example and as is apparent from FIG. 8, since each edge corner tends to produce a wear sector at a unique location along the slope of a given inclined surface of the roller 801, such that inversion and reinstallation of the roller exposes unworn or "fresh" friction surfaces to each of the edge corners. In other embodiments, such as shown in FIG. 9, multiple edge-cleaning rollers 801 may be inventively oriented at one of two preferably equal and opposite angles to the plane of rotation of the wafer W, e.g., for balancing of out-of-plane forces imparted to the wafer W by the angled rollers.

Finally, it should be understood that the inventive edge cleaning rollers described herein are each independently inventive, and may be employed in apparatuses other than those adapted to scrub a wafer's major surface. Further, as will be apparent to those of ordinary skill in the art, the inventive rollers may be employed to clean the edge of a wafer supported in any orientation (e.g., horizontal, vertical, etc.). Thus the inventive edge cleaning rollers may be advantageously employed in a vertically-oriented scrubber such as that disclosed in U.S. Pat. No. 6,575,177, the entire disclosure of which is incorporated herein by this reference.

Accordingly, while the present invention has been disclosed in connection with exemplary embodiments thereof, it should be understood that other embodiments may fall within the spirit and scope of the invention, as defined by the following claims.

What is claimed is:

1. A side-contact roller for contacting one or more major surfaces of a wafer rotating within a wafer cleaner, comprising:
    a first and second guide surface, wherein each of the first and second surfaces is inclined and includes a low-friction material adapted to facilitate sliding a wafer edge between the sloped first and second guide surfaces;
    a first frictional planar surface adapted to achieve frictional contact with a first edge-adjacent region of a first major surface of the wafer;
    a second frictional planar surface adapted to achieve frictional contact with a second edge-adjacent region of a second major surface of the wafer;
    wherein the first and second frictional planar surfaces form the sides of a channel, such that an edge of the wafer may be accommodated between the first and second frictional planar surfaces; and
    wherein the first and second guide surface material is low-friction relative to the first and second frictional planar surfaces of the side-contact roller.

2. The side-contact roller of claim 1, wherein the side-contact roller is adapted to rotate the wafer via frictional contact between the channel sides and the edge-adjacent regions of the wafer.

3. The side-contact roller of claim 2, wherein the channel sides are adapted to prevent the wafer from tilting during rotation.

4. The side-contact roller of claim 1, further comprising a cylindrical edge surface disposed between the first and second frictional planar surfaces.

5. The side-contact roller of claim 4, wherein a gap is maintained between the cylindrical edge surface of the side-contact roller and a corresponding cylindrical edge surface of the wafer.

6. The side-contact roller of claim 1, wherein the first and second frictional planar surfaces are adapted to clean the edge-adjacent regions of the first and second major surfaces of the wafer.

* * * * *